United States Patent [19]

Fowler et al.

[11] 4,389,768

[45] Jun. 28, 1983

[54] SELF-ALIGNED PROCESS FOR FABRICATING GALLIUM ARSENIDE METAL-SEMICONDUCTOR FIELD EFFECT TRANSISTORS

[75] Inventors: Alan B. Fowler, Yorktown Heights; Robert Rosenberg, Peekskill; Hans S. Rupprecht, Yorktown Heights, all of N.Y.

[73] Assignee: International Business Machines Corporation, Armonk, N.Y.

[21] Appl. No.: 255,187

[22] Filed: Apr. 17, 1981

[51] Int. Cl.$^3$ .................................. H01L 21/225
[52] U.S. Cl. ................................ 29/571; 29/580; 148/187; 148/188
[58] Field of Search ............. 148/187, 188; 29/571, 29/580; 357/22 S, 15

[56] References Cited

U.S. PATENT DOCUMENTS

| | | | |
|---|---|---|---|
| 3,479,234 | 11/1969 | Gray | 148/188 X |
| 3,574,010 | 4/1971 | Brown | 148/188 |
| 3,713,912 | 1/1973 | Schwartz | 148/187 |
| 3,855,690 | 12/1974 | Kim et al. | 29/571 |
| 3,943,622 | 3/1976 | Kim et al. | 29/571 X |
| 4,111,725 | 9/1978 | Cho et al. | 357/59 X |
| 4,222,164 | 9/1980 | Triebwasser | 29/571 |
| 4,287,661 | 9/1981 | Stoffel | 148/187 X |

FOREIGN PATENT DOCUMENTS 52-74285  6/1977  Japan .................................. 29/571

Primary Examiner—G. Ozaki
Attorney, Agent, or Firm—Yen S. Yee

[57] ABSTRACT

A method for the fabrication of a gallium arsenide (GaAs) metal-semiconductor field effect transistor (MESFET) is described. The method requires the step of providing a semi-insulating GaAs substrate having thereon a layer of n doped GaAs and another layer of n+ doped $Ga_{1-x}Al_xAs$, the latter being used as a diffusion source for n dopants in selectively doping the n GaAs layer underneath. The fabrication method further includes the step of employing highly directional reactive ion etching on silicon nitride to build insulating side walls thereby to effect the self-alignment of the gate of the MESFET with respect to its source and drain. GaAs MESFET fabricated using this method has its source and drain in close proximity having its gate therebetween. Utilizing the disclosed method, conventional photolithographic techniques can be employed to produce submicron self-aligned GaAs MESFETs.

36 Claims, 7 Drawing Figures

SELF-ALIGNED PROCESS FOR FABRICATING GALLIUM ARSENIDE METAL-SEMICONDUCTOR FIELD EFFECT TRANSISTORS

DESCRIPTION

Technical Field

This invention relates generally to a gallium arsenide (GaAs) integrated circuit fabrication technology, and more particularly to a method for fabricating a self-aligned GaAs metal-semiconductor field effect transistor (MESFET).

BACKGROUND ART

The high speed performance characteristics of a field effect transistor (FET) depend on, among other things, the carrier mobility, the channel length, and the parasitic channel resistance of the device. Since the bulk mobility is substantially higher in GaAs than it is in silicon, substantially higher performance can be achieved using integrated circuits fabricated with GaAs than can be achieved with silicon for an equivalent speed-power product operation.

The early GaAs MESFET structures had relatively large gate to drain separation and gate to source separation. An article by Mead, entitled "Schottky Barrier Gate Field Effect Transistor", Proceeding of the IEEE 54, 307 (1966) describes such an early structure. These early MESFET structures typically had gate to source and gate to drain separation dimensions of the same order as the gate length. As a result, the minimum source to drain separation for such early structures was about three times the minimum gate length. Since only the region beneath the gate was electrically controlled for the conduction of electric current, the remaining two-thirds of the channel contributed to parasitic resistance as well as to an accompanying parasitic channel capacitance. Such early structures had a disadvantage of low level of circuit integration because of the rather large device size. The inherent parasitic effects of such early device structure also detrimentally impact its performance and pose a performance limit well below the fundamental performance limit of the GaAs MESFET.

Drangied in U.S. Pat. No. 3,609,477 addresses the problem of parasitic channel resistance. According to this patent, highly conductive materials are used in the parasitic channel region to thereby reduce the problem of parasitic channel resistance.

The problems of parasitic channel resistance are also appreciated in U.S. Pat. Nos. 3,855,690 and 3,943,622 to Kim et al. According to these patents, the parasitic channel resistance can be reduced by growing faceted source and drain regions, also known as mesas. These regions or mesas are spaced apart and with facets having overgrown edge portions. The faceted sources and drains are employed as masks for deposition of a gate. The overgrowth portion provides shielding of the surface in the immediate vicinity of the source and the drain, thereby preventing shorting between the source (or the drain) and the gate.

A prior self-aligned GaAs field effect transistor (FET) is described by Schwartz in U.S. Pat. No. 3,713,912. The disclosed structure includes an n type GaAs substrate and a semi-insulating layer bearing a conducting surface coating thereon. An insulated gate FEt is formed by generating a pair of windows in such layer and introducing either p type or n type material through the windows.

Another prior self-aligned GaAs FET structure is described in U.S. Pat. No. 4,111,725 to Cho et al. The disclosed device structure includes an n GaAs mesa serving as the gate bounded laterally by n+ GaAs epitaxial layers serving as source and drain. The source and drain layers are formed by molecular beam epitaxy and the resulting device is also an insulated gate FET (a MISFET), not a MESFET.

Triebwasser in U.S. Pat. No. 4,222,164 describes a self-aligned MESFET structure, wherein the channel spacing between the drain and source is substantially reduced. According to the patent, the source, drain and gate isolation is provided by an insulator therebetween. The disclosed device is fabricated on a semiconductor body having an epitaxial layer of opposite polarity thereon.

Disclosure of Invention

It is a principal object of the present invention to provide a method for fabricating a high performance self-aligned GaAs MESFET having both reduced parasitic channel resistance and accompanying parasitic capacitance.

Another principal object of the invention is to provide a simple process for making a self-aligned GaAs MESFET.

It is an object of this invention to provide a method for fabricating a gallium arsenide MESFET with minimum channel length.

A further object of this invention is to provide a process for making self-aligned gallium arsenide MESFET devices of minimum area to effect a high level of circuit integration.

It is yet another object of this invention to provide a method for making a submicron self-aligned GaAs MESFET using conventional photolithographic techniques.

These and other objects of this invention will become apparent from studying the fabrication method for a self-aligned GaAs field effect transistor as herein described. A self-aligned GaAs MESFET is made by providing a structure comprising a semi-insulating GaAs substrate having a first layer of n doped GaAs and having thereon a second layer of n+ $Ga_{1-x}Al_xAs$ with $x \geq 0.15$. A first photoresist layer is applied on said structure. This first photoresist layer is then selectively exposed and developed to provide a patterned opening defining a transistor region and a field region. The first layer and the second layer thereon in said field region are removed by etching selectively down to the semi-insulating GaAs level. A second photoresist layer is applied on the structure and is then exposed and developed to provide a patterned opening defining a gate region within the transistor region. The second layer in the gate region is then selectively etched to form two mesas having the gate therebetween. The resulting structure is then capped with silicon nitride ($Si_3N_4$).

The source and drain of the GaAs MESFET are formed by driving selectively the n+ dopants from the second layer to the first layer in the regions of the two mesas using conventional thermal diffusion process. Highly directional reactive ion etching is then employed to remove substantially the $Si_3N_4$ layer down to the oxide substrate level in the gate region, and leaving side walls of $Si_3N_4$ layer on the sides of the two mesas. The second layer in the two mesas are then removed exposing the source and drain of the GaAs MESFET having isolation provided by the Si$_3$N$_4$ side walls. A metal layer is then deposited to form the gate of the GaAs MESFET and to make electrical contact with the drain and source of the GaAs MESFET having isolation provided by Si$_3$N$_4$ side walls. The resulting GaAs MESFET structure formed using this method has its source and drain in close proximity with the gate therebetween.

Alternatively, the especially novel steps of the present invention can be described succinctly in another way. More particularly, in a method for fabricating MESFET wherein a pair of diffusion sources are disposed on a semiconductor layer, and are spaced apart by a first distance, the especially novel steps include: (a) forming on said diffusion sources, and surrounding said diffusion sources at the peripheries thereof with insulation to provide an exposed region of said semiconductor layer between said diffusion sources, thereby defining a gate area having the length of said gate area less than said first distance; (b) outdiffusing said diffusion sources to provide a pair of doped regions in said semiconductor layer forming the source and drain of said FET, which source and drain, as a result of out-diffusion in the lateral direction, are spaced apart by a distance less than said first distance but greater than the length of said gate area; and (c) removing said diffusion sources to provide additional exposed regions of said semiconductor layer over said source and drain, all of said exposed regions being surrounded by insulation. Utilizing the disclosed method including the above novel steps, conventional photo-lithographic techniques can be employed to produce submicron self-aligned GaAs MESFETs.

The nature, principle, and utility of the present invention will be better understood from the hereinafter detailed description of the invention when read in conjunction with the accompanying drawings.

BRIEF DESCRIPTION OF DRAWINGS

Details of the invention will be described in connection with the accompanying drawings, in which.

BEST MODE FOR CARRYING OUT THE INVENTION

Figure 1A:
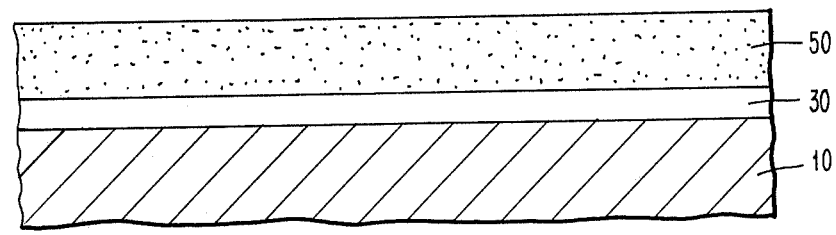
FIGS. 1A–G are cross sectional views of a portion of a self-aligned metal-semiconductor field effect transistor illustrating the steps in the fabrication of the device in accordance with the method of the present invention.
Figure 1B:
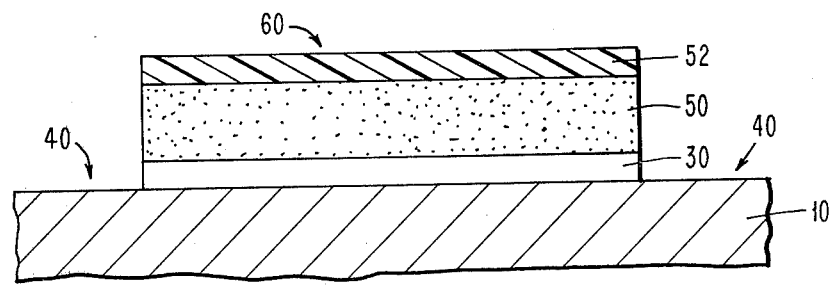
Figure 1C:
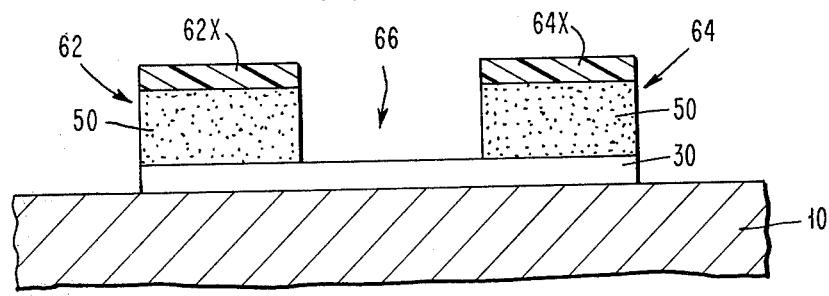
Figure 1D:
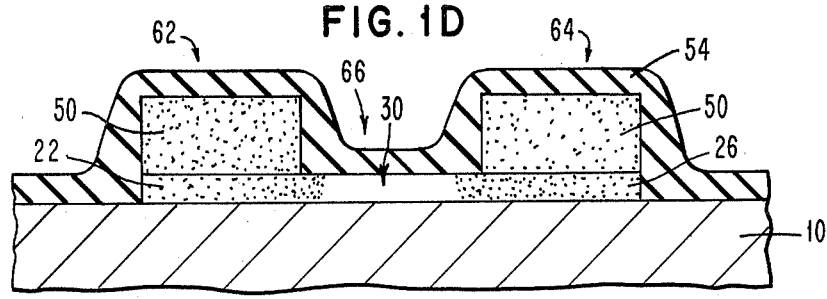
Figure 1E:
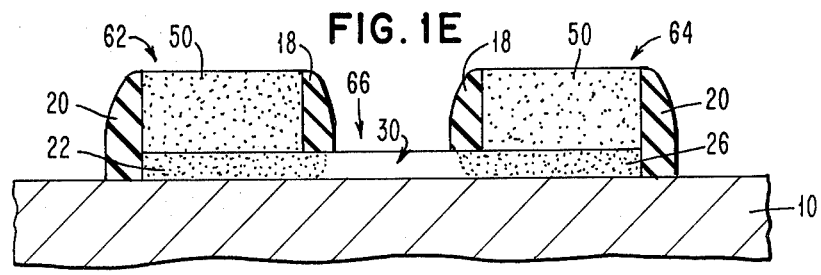
Figure 1F:
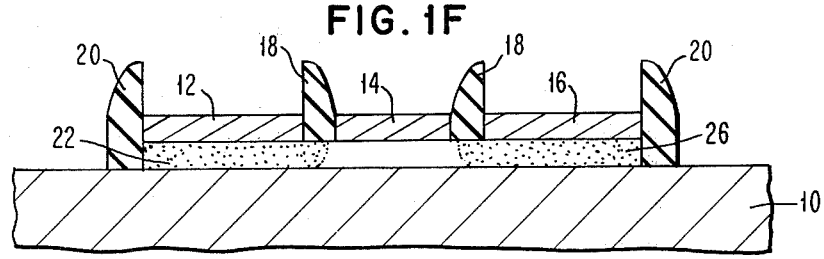
Figure 1G:
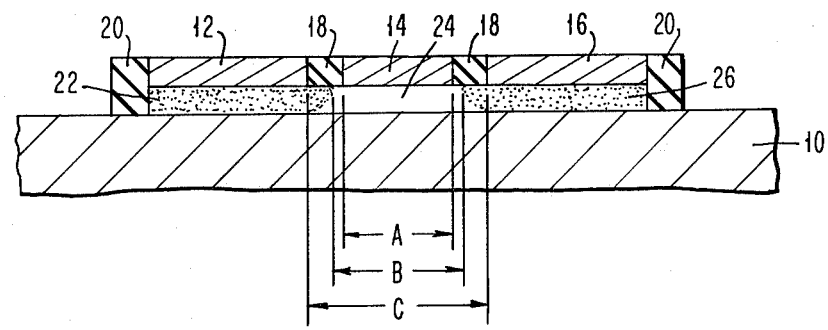

Referring to FIG. 1G, substrate 10 contains thereon a self-aligned MESFET made in accordance with the method of this invention. The MESFET is a three-terminal device comprising a metal gate 14 over channel 24, a n+ source 22 and a n+ drain 26. The same metal layer used to form the gate 14 is used to provide a source metal contact 12 and drain metal contact 16. Electrical isolations between the gate 14 and its two metal source and drain contacts 12 and 16 are provided by oxide side walls 18. Adjacent device isolations are provided by oxide side walls 20. Operation of the MESFET embracing electrical conduction between the source 22 and drain 26 by way of channel 24 under the influence of an electrical potential on the gate 14 is governed by the well-known theory of Schottky-barrier field effect transistor operation.

Self-Aligned MESFET Fabrication

FIG. 1A–1G illustrates sequential steps in the fabrication of the self-aligned GaAs MESFET according to the method of the present invention. Referring to FIG. 1A, a MESFET is produced on a semi-insulating substrate 10, for example, a 15 ml-thick GaAs substrate. A first lightly doped semiconducting layer 30 is formed on substrate 10. For example, such semiconducting layer 30 is preferably either a n— or n type GaAs. Such a lightly doped semiconducting layer 30 is formed by conventional chemical vapor deposition or by known molecular beam epitaxy (MBE) technique. Alternatively, the lightly doped semiconductor layer 30 may also be formed by known liquid phase epitaxy (LPE) or metal organic vapor phase epitaxy (MOVPE) or ion implanation techniques. The doping level for semiconductor layer 30 ranges from $5 \times 10^{16}$ to $5 \times 10^{17}$/cm$^3$, and its thickness ranges from 100 nm to 300 nm.

A second layer of heavily doped semiconducting layer 50, which is of the same conductivity tape as in the first layer 30, is formed on top of the first layer 30. For example, such heavily doped semiconducting layer 50 is preferably a n+ doped Ga$_{1-x}$Al$_x$As having $x \geq 0.15$. Heavily doped second layer 50 may also be formed by known LPE, MBE, or MOVPE techniques. Such second layer 50 preferably has a selenium and/or sulphur dopant with a doping level at about $10^{19}$/cm$^3$. Layer 50 has a film thickness ranging from 200 nm to 50 nm and an aluminum content equal to or larger than 15%, i.e., $x \geq 0.15$. It is to be understood, as is appreciated by persons having ordinary skill in this art, that indium or other such suitable material may also be used in the place of aluminum in layer 50.

Referring to FIG. 1B, a first photoresist layer 52 is disposed on the second layer 50. Photoresist layer 52 is then selectively exposed and developed to provide a patterned opening by conventional photolithographic techniques defining a transistor region 60 for the self-aligned MESFET, and a field region 40. The field region 40 is selectively etched down to the substrate 10 level to remove the first and second layers 30 and 50 and thereby exposing substrate 10 in the field region 40.

Next, a second photoresist layer is applied to the resulting structure shown in FIG. 1B. This second layer is then selectively exposed and developed to provide a patterned opening by conventional photolithographic techniques defining a gate region 66 (see FIG. 1C) within the transistor region 60 (see also FIG. 1B). The gate region 66 is etched selectively by conventional chemical means to remove layer 50 so as to form the two mesas 62 and 64 having the gate region 66 therebetween. It should be noted that the layers 62X and 64X are, in fact, the aforementioned second photoresist layer remaining after the selective development.

Referring to FIGS. 1D and 1E, the resulting structure with two mesas 62 and 64 and gate region 66 therebetween, is capped with a dielectric material 54 such as silicon nitride (Si$_3$N$_4$). Other dielectric films such as oxi-nitride (Si$_x$N$_y$O$_z$, with x, y and z each an arbitrary number) are also suitable. The source 22 and drain 26 of the MESFET are then formed by driving selectively the n+ dopant from the heavily doped second layer 50 to the lightly doped first layer 30 within the regions of the two mesas 62 and 64. The dopant drive-in is accomplished by conventional thermal diffusion process. Lateral diffusion, as a result of this thermal diffusion drive-in gives rise to n+ source 22 and drain 26 extending beneath the side walls 18 in the gate region 66.

In the step illustrated by FIG. 1E, reactive ion etching is used to remove the silicon nitride layer 54 (see also FIG. 1D). Reactive ion etching as applied in this step is highly directional. As a result of these highly directional etchings, silicon nitride layer 54 in the gate region 66 is substantially removed exposing the GaAs substrate 10 and leaving silicon nitride side walls 18 and 20 on the sides of the two mesas 62 and 64. Dielectric side walls 18 are preferred to have a thickness about 500 nm or less. This thickness dimension is constrained by manufacturing reproducibility and by other considerations which include, on the one hand, the desirability of having thin side walls 18 so as to reduce both the overall MESFET device size and the parasitic channel resistance as well as the accompanying parasitic capacitance, both of which tend to limit the MESFET performance; and on the other hand, the need to have thick side walls 18 to ensure that gate 14 (FIG. 1F) does not substantially reach the source 22 and drain 26 extending beneath side walls 18 as a result of lateral diffusion. The latter is important so as to prevent premature breakdown of the MESFET device.

In the process steps illustrated in FIGS. 1E and 1F, the heavily doped layer 50 in the two mesas 62 and 64 are then removed preferably by conventional wet chemistry processing exposing the source 22 and the drain 26. An aluminum metal layer is then deposited to form the gate 14 and to make electrical contact with the source 22 and drain 26 of the MESFET having electrical isolation provided by the silicon nitride side walls 18 and 20.

As an optional step to effect a planar device structure, i.e., to remove ridges formed by the $Si_3N_4$ side walls 18, and 20 in FIG. 1F, a conformal blanket coat (not shown) may be applied to the surface of the structure in FIG. 2F. Such a blanket coat is characterized by having an etch rate substantially the same as the etch rate of $Si_3N_4$ under subsequently applied plasma etching condition. As examples, organic photoresist or poly-imide, is suitable material for forming such a blanket coat. The resulting structure covered with such a blanket coat is then plasma etched uniformly until the metal (12, 14 and 16) level is reached, whereby side walls 18 and 20, metal gate 14, source contact 12, and drain metal contact 16, form a planar surface, and result in the structure shown in FIG. 1G.

As can be seen, MESFET fabricated according to the method shown in FIG. 1A-1G has its source 22 and drain 26 in close proximity with gate 14 therebetween. Such a self-aligned MESFET device is characterized by a short channel 24 that has both substantially reduced parasitic channel resistance and accompanying parasitic channel capacitance. The device structure also has a minimum geometry because each of its gate 14, source 22, and drain 26 regions is defined by minimum lithographic feature size. Hence, self-aligned MESFETs made in accordance with this novel and unobvious method do not have the undesirble performance limitations imposed by heretofore device structures having longer channel and larger device size. Furthermore, since the device is fabricated in GaAs, which has substantially higher bulk mobility than silicon, the self-aligned GaAs MESFET fabricated according to the present invention is capable of substantially higher switching speed. Additional performance improvements are also achieved because submicron channel length MESFETs can be fabricated using only conventional photolithography, which improvements, are to be described next.

It is important to note and appreciate that a submicron self-aligned MESFET can be made by the method disclosed herein utilizing only conventional photolithography. More specifically, with reference to FIGS. 1E, 1F and 1G, assuming the dimension of gate region 66 is defined by a minimum feature size C of 1 micron by conventional photo-lithographic techniques, the length A of the gate 14 would be the minimum feature size C defining the gate region 66 less the width of the two dielectric side walls 18 on each side. Typically, the width of such side walls 18 can be made to be 250 nm quite consistently by directional reactive ion etching techniques. This gives rise to a self-aligned GaAs MESFET having a gate length of about 0.5 micron, and having the length B of channel 14 also close to but less than this dimension because of the lateral out diffusions beneath side walls 18 extending from both the source 22 and drain 26, as described heretofore. Submicron device is advantageous because it contributes directly to higher circuit performance. The minimum device geometry achievable using an inherently simple process utilizing conventional photolithography also yields additional advantages, which are to be described next.

Since both the source 22 and drain 26 of the MESFET are highly doped n+ regions having high conductivity, the same aluminum metal layer used to form the gate 14 can also be used to make electrical contacts 12 and 16 directly to the source 22 and drain 26, respectively, without another layer of metal or the requirement of contact masks and additional processing steps. The fact that submicron GaAs self-aligned MESFETs can be made utilizing only conventional photolithography makes the process even more attractive. This new process for making self-aligned GaAs MESFETs is inherently simple and is capable of supporting a high level of circuit integration. This aspect is important because a simple process which supports a high level of circuit integration contributes directly to yield, reliability and cost improvements.

In summary, large scale integration chips utilizing GaAs self-aligned MESFETs made according to the present invention are capable of higher performance and greater economy.

Although for the purpose of best illustrating the present invention, a signal isolated MESFET has been illustrated and described heretofore, it is understood by one ordinarily skilled in this art that individual MESFETs can be arranged to share a common source/drain to produce useful circuits incorporating the essence of the present invention.

Although the above-described pattern defining steps in FIG. 1A-1G are shown and described in terms of conventional photolithographic techniques, it is to be understood, that other lithographic techniques, such as electron beam lithography and/or X-ray lithography may be employed to define the patterns in the present disclosed method without deviating from the scope and spirit of the present invention.

Although the above-described method for making a GaAs self-aligned MESFET in FIG. 1A-1G is shown and described in conjunctin with a device structure of the n conductivity type, it is clear that the method is also applicable for making device structures of the other conductivity type.

From the preceding detailed description of Applicants' invention, it can be seen that MESFET devices fabricated using the method in accordance with the present invention have advantages heretofore not possible to achieve. In addition to the variations and modifications of Applicants' disclosed method, which have been suggested, many other variations and modifications will be apparent to those skilled in the art, and accordingly, the scope of Applicants' invention is not to be construed to be limited to the particular embodiments shown or suggested.

We claim:

1. In a method for fabricating a field effect transistor (FET) wherein a pair of diffusion sources are disposed on a semiconductor layer, and are spaced apart by a first distance, the steps of:

forming on said diffusion sources and, surrounding said diffusion sources at the peripheries thereof with insulation to provide an exposed region of said semiconductor layer between said diffusion sources, thereby defining a gate area having the length of said gate area less than said first distance;

driving said diffusion sources to provide a pair of doped regions in said semiconductor layer forming the source and drain of said FET, which source and drain, as a result of out-diffusion in the lateral direction, are spaced apart by a distance less than said first distance but greater than the length of said gate area; and removing said diffusion sources to provide additional exposed regions of said semicondutor layer over said source and drain, all of said exposed regions being surrounded by insulation.

2. In a method for fabricating a FET as set forth in claim 1 after said step of removing said diffusion sources, including a step of forming electrodes over said gate area, said source and drain having isolations of said electrodes provided by said insulation.

3. In a method for fabricating a FET as set forth in claim 1 wherein the step of outdiffusing said diffusion sources is by driving dopants from said diffusion sources into said semiconductor layer using thermal diffusion means.

4. In a method for fabricating a FET as set forth in claim 1 wherein said step of surrounding said diffusion sources includes the steps of:

forming a layer of insulation over said diffusion sources and said semiconductor layer; and etching directionally to remove substantially said insulation layer to provide an exposed region of said semiconductor layer interposing said diffusion sources, and leaving side walls of said insulation on the sides of diffusion sources thereby defining a gate area having the length of said gate area less than said first distance.

5. In a method for fabricating a FET as set forth in claim 4 after said etching step, including a step of forming electrodes over said gate area, said source and drain having isolations of said electrodes provided by said side walls of said insulation.

6. In a method for fabricating a FET as set forth in claim 5 wherein said semiconductor layer is gallium arsenide (GaAs).

7. In a method for fabricating a FET as set forth in claim 6 wherein said diffusion sources are $Ga_{1-x}Al_xAs$, and where $X \geq 0.15$.

8. In a method for fabricating a FET as set forth in claim 4 wherein said directional etching step is reactive ion etching.

9. A method for fabricating a metal semiconductor field effect transistor (MESFET) comprising the steps of:

providing a structure comprising a semi-insulating substrate having a first lightly doped layer of a first conductivity type and having thereon a second heavily doped layer of said first conductivity type;

defining on said structure a field region and a transistor region having a gate region between a source region and a drain region;

etching selectively to remove said first and second layers exposing said substrate in said field region, and removing said second layer in said gate region within said transistor region;

forming a dielectric layer over said structure;

forming the source and drain of said MESFET by driving selectively the dopants from said second layer to said first layer in said source and drain regions using said second layer as diffusion sources;

etching directionally to remove substantially said dielectric layer in said gate region exposing said substrate, and leaving side walls of said dielectric layer on the sides of said source and drain regions;

removing said second layer in said source and drain regions exposing the source and the drain of said MESFET; and depositing a metal layer onto said structure to form the gate of said MESFET and to make electrical contacts with the source and drain of said MESFET having isolations provided by said dielectric side walls.

10. A method for fabricating a MESFET as set forth in claim 9 wherein said semi-insulating substrate is gallium arsenide (GaAs).

11. A method for fabricating a MESFET as set forth in claim 9 wherein said first leayer is n type.

12. A method for fabricating a MESFET as set forth in claim 9 wherein said first layer is lightly doped GaAs.

13. A method for fabricating a MESFET as set forth in claim 9 wherein said second layer is heavily doped $Ga_{1-x}Al_xAs$, and wherein $x \geq 0.15$.

14. A method for fabricating a MESFET as set forth in claim 9 wherein said dielectric layer is silicon nitride ($Si_3N_4$).

15. A method for fabricating a MESFET as set forth in claim 9 wherein said forming of the source and drain is by driving the dopants using thermal diffusion means.

16. A method for fabricating a MESFET as set forth in claim 9 wherein said directional etching step is reactive ion etching.

17. A method for fabricating a MESFET as set forth in claim 9 wherein said metal layer is aluminum.

18. A method for fabricating a MESFET as set forth in claim 9 after said step of depositing a metal layer, including a step of etching said dielectric side walls whereby said side walls, said metal gate, and said source and drain metal contacts form a planar surface.

19. A method for fabricating a self-aligned metal semiconductor field effect transistor (MESFET) comprising the steps of:

providing a structure comprising a semi-insulating substrate having a first lightly doped layer of a first conductivity type and having thereon a second heavily doped layer of said first conductivity type;

applying a first photoresist layer onto said structure;

exposing and devloping selectively said first photoresist layer to provide a patterned opening defining a transistor region and a field region;

etching selectively to remove said second layer and said first layer underneath said second layer in said field region exposing said semi-insulating substrate;

applying a second photoresist layer onto said structure;

exposing and developing said second photoresist layer to provide a patterned opening defining a gate region within said transistor region;

etching selectively said gate region to remove said second layer, and forming two mesas having said gate region therebetween;

forming a dielectric layer over said structure;

forming the source and drain of said MESFET by driving selectively the dopants from said second layer to said first layer in the regions of said two mesas using said second layer as diffusion sources;

etching directionally using reactive ion etching to remove substantially said dielectric layer in said gate region exposing said substrate, and leaving side walls of dielectric layer on the sides of said two mesas;

removing said second layer in said two mesas exposing the source and drain of said MESFET; and depositing a metal layer onto said structure to form the gate of said MESFET, and to make electrical contacts with the drain and source of said MESFET having isolations of the drain, source and gate provided by said dielectric side walls.

20. A method for fabricating a self-aligned MESFET as set forth in claim 19 wherein said semi-insulating substrate is gallium arsenide (GaAs).

21. A method for fabricating a self-aligned MESFET as set forth in claim 19 wherein said first layer is n type.

22. A method for fabricating a self-aligned MESFET as set forth in claim 19 wherein said first layer is lightly doped GaAs.

23. A method for fabricating a self-aligned MESFET as set forth in claim 19 wherein said second layer is heavily doped $Ga_{1-x}Al_xAs$, and wherein $x \geq 0.15$.

24. A method for fabricating a self-aligned MESFET as set forth in claim 19 wherein said dielectric layer is silicon nitride ($Si_3N_4$).

25. A method for fabricating a self-aligned MESFET as set forth in claim 19 wherein said forming of the source and drain is by driving the dopants using thermal diffusion means.

26. A method for fabricating a self-aligned MESFET as set forth in claim 19 wherein said metal layer is aluminum.

27. A method for fabricating a self-aligned MESFET as set forth in claim 19 after said step of depositing a metal layer, including a step of etching said dielectric side walls whereby said side walls, said metal gate, and said source and drain metal contacts form a planar surface.

28. A method for fabricating a self-aligned metal semiconductor field effect transistor (MESFET) comprising the steps of:

forming a first lightly doped layer of a first conductivity type onto a semi-insulating substrate;

forming a second heavily doped layer of said first conductivity type onto said first layer to form a production structure;

applying a first photoresist layer onto said structure;

exposing and developing selectively said first photoresist layer to provide a patterned opening defining a transistor region and a field region;

etching selectively to remove said second layer and said first layer underneath said second layer in said field region exposing said semi-insulating substrate;

applying a second photoresist layer onto said structure;

exposing and developing said second photoresist layer to provide a patterned opening defining a gate region within said transistor region;

etching selectively said gate region to remove said second layer, and forming two mesas having said gate region therebetween;

forming a dielectric layer over said structure;

forming the source and drain of said MESFET by driving selectively the dopants from said second layer to said first layer in the regions of said two mesas using said second layer as diffusion sources;

etching directionally using reactive ion etching to remove substantially said dielectric layer in said gate region exposing said substrate, and leaving side walls of dielectric layer on the sides of said two mesas;

removing said second layer in said two mesas exposing the source and drain of said MESFET; and depositing a metal layer onto said structure to form the gate of said MESFET, and to make electrical contacts with the drain and source of said MESFET having isolations of the drain, source and gate provided by said dielectric side walls.

29. A method for fabricating a self-aligned MESFET as set forth in claim 28 wherein said semi-insulating substrate is gallium arsenide (GaAs).

30. A method for fabricating a self-aligned MESFET as set forth in claim 28 wherein said first layer is n type.

31. A method for fabricating a self-aligned MESFET as set forth in claim 28 wherein said first layer is lightly doped GaAs.

32. A method for fabricating a self-aligned MESFET as set forth in claim 28 wherein said second layer is heavily doped $Ga_{1-x}Al_xAs$, and wherein $x \geq 0.15$.

33. A method for fabricating a self-aligned MESFET as set forth in claim 28 wherein said dielectric layer is silicon nitride ($Si_3N_4$).

34. A method for fabricating a self-aligned MESFET as set forth in claim 28 wherein said forming of the source and drain is by driving the dopants using thermal diffusion means.

35. A method for fabricating a self-aligned MESFET as set forth in claim 28 wherein said metal layer is aluminum.

36. A method for fabricating a self-aligned MESFET as set forth in claim 28 after said step of depositing a metal layer, including a step of etching said dielectric side walls whereby said side walls, said metal gate, and said source and drain metal contacts form a planar surface.

* * * * *